US010741715B2

(12) United States Patent
Takeuchi et al.

(10) Patent No.: US 10,741,715 B2
(45) Date of Patent: Aug. 11, 2020

(54) LIGHT-RECEIVING ELEMENT AND NEAR INFRARED LIGHT DETECTOR

(71) Applicants: KONICA MINOLTA, INC., Chiyoda-ku (JP); THE UNIVERSITY OF TOKYO, Bunkyo-ku (JP)

(72) Inventors: Yuichi Takeuchi, Hino (JP); Takuji Hatano, Suita (JP); Yasuhiko Ishikawa, Bunkyo-ku (JP)

(73) Assignees: Konica Minolta, Inc., Tokyo (JP); The University of Tokyo, Tokyo (JP)

( * ) Notice: Subject to any disclaimer, the term of this patent is extended or adjusted under 35 U.S.C. 154(b) by 0 days.

(21) Appl. No.: 16/320,394

(22) PCT Filed: Jul. 20, 2017

(86) PCT No.: PCT/JP2017/026190
§ 371 (c)(1),
(2) Date: Jan. 25, 2019

(87) PCT Pub. No.: WO2018/021126
PCT Pub. Date: Feb. 1, 2018

(65) Prior Publication Data
US 2019/0267507 A1     Aug. 29, 2019

(30) Foreign Application Priority Data
Jul. 26, 2016   (JP) ................... 2016-146565

(51) Int. Cl.
   *H01L 31/107*     (2006.01)
   *H01L 27/144*     (2006.01)
   *H01L 31/0216*     (2014.01)

(52) U.S. Cl.
CPC ...... *H01L 31/1075* (2013.01); *H01L 27/1446* (2013.01); *H01L 31/02161* (2013.01); *H01L 31/107* (2013.01)

(58) Field of Classification Search
CPC ............... H01L 31/1075; H01L 31/107; H01L 31/02161; H01L 27/1446
See application file for complete search history.

(56) References Cited

U.S. PATENT DOCUMENTS

| 2013/0048838 A1 | 2/2013 | Mori et al. |
| 2014/0151839 A1 | 6/2014 | Kang et al. |

(Continued)

FOREIGN PATENT DOCUMENTS

| JP | 2009-124145 | 6/2009 |
| JP | 2011-222874 | 11/2011 |

(Continued)

OTHER PUBLICATIONS

Search Report dated Jul. 11, 2019 issued in European Patent Application No. 17834134.3.

(Continued)

*Primary Examiner* — Anthony Ho
(74) *Attorney, Agent, or Firm* — Cozen O'Connor

(57) ABSTRACT

The present invention addresses the issue of providing: a light-receiving element that has an absorption layer of germanium (Ge), is capable of efficiently receiving near infrared light having a large light-reception sensitivity in the absorption layer, from a free space, and has high productivity and low production cost; and a near infrared light detector comprising said light-receiving element. This light-receiving element 10 has, laminated in order upon a substrate 20, an amplification layer 30 containing silicon (Si), an absorption layer 40 containing germanium (Ge), and an antireflection layer 50. The amplification layer 30 has, in order upon the substrate 20, at least an n-doped n-Si layer 31 and a p-doped p-Si layer 33. The absorption layer 40 has at least a p-doped p-Ge layer 42.

10 Claims, 5 Drawing Sheets

(56) References Cited

U.S. PATENT DOCUMENTS

2014/0239301 A1    8/2014   Huang et al.
2014/0291682 A1   10/2014   Huang et al.

FOREIGN PATENT DOCUMENTS

| JP | 2014-107562 | 6/2014 |
| JP | 2014-130890 | 7/2014 |
| WO | WO 2008/011323 | 1/2008 |
| WO | WO 2014/190189 | 11/2014 |

OTHER PUBLICATIONS

Preliminary Report on Patentability and Written Opinion dated Jan. 29, 2019 issued in International Patent Application No. PCT/JP2017/026191.

M. Morse et al., "Performance of Ge/Si receivers at 1310nm," Physica E, 2009.05, vol. 41, Issue 6, 1076-1081.

J. Michel et al., "High-performance Ge-on-Si photodetectors", Nature Photonics, vol. 4, Aug. 2010. www.nature.com/naturephotonics.

Preliminary Report on Patentability and Written Opinion dated Jan. 29, 2019 issued in International Patent Application No. PCT/JP2017/026190.

Office Action dated Apr. 16, 2020 issued in European Patent Application No. 17834134.3.

- ——— (a) Absence of antireflection layer
- ---------- (b) Refractive index 1.2
- – – – (c) Refractive index 1.4
- —··—··— (d) Refractive index 2.0
- —·—·— (e) Refractive index 3.0
- — — — (f) Refractive index 3.5

LIGHT-RECEIVING ELEMENT AND NEAR INFRARED LIGHT DETECTOR

RELATED APPLICATIONS

This is a U.S. National Phase Application under 35 USC 371 of International Application PCT/JP2017/026190 filed on Jul. 20, 2017.

This application claims the priority of Japanese application no. 2016-146565 filed Jul. 26, 2016, the entire content of which is hereby incorporated by reference.

TECHNICAL FIELD

The present invention relates to a light-receiving element and a near infrared light detector. More specifically, the present invention relates to a light-receiving element which has an absorption layer of germanium (Ge), is capable of efficiently receiving near infrared light with high light-receiving sensitivity in the absorption layer from free space, and is produced with high productivity and low production cost. Further, the present invention relates to a near infrared light detector provided with the light-receiving element.

BACKGROUND

In the past, in measuring instruments such as a laser radar (ridar), for example, from the viewpoint of eye-safe, near infrared light with a wavelength of 1550 nm is projected from a light source and the light is received by a light-receiving element to measure the object. Currently, although there are various options regarding the light source, options for the light-receiving element are limited, and there are many problems.

As a conventional light-receiving element having a light-receiving sensitivity to these near infrared lights, from the viewpoint of low noise and fast response speed, for example, a compound semiconductor such as indium gallium arsenide (InGaAs) is often used. However, the method using indium gallium arsenide (InGaAs) has a problem that productivity is very poor and high manufacturing cost is required. Therefore, there is a need for a new light-receiving element which is high in productivity and may suppress the manufacturing cost.

Incidentally, a light-receiving element using germanium (Ge) as an absorbing layer is known as a light-receiving element having a light-receiving sensitivity in the near infrared region around a wavelength of 1550 nm without using indium gallium arsenide (InGaAs).

As such a light-receiving element, by using germanium (Ge) or silicon (Si)-germanium (Ge) as an intrinsic semiconductor, an optical element that absorbs light having a wavelength in the near-infrared region and is suitably usable for applications such as optical communication is disclosed (Patent document 1). Patent document 1 discloses an avalanche photodiode (APD) having a p-doped region, an intrinsic region and an n-doped region, and at least one of a p-doped region and an n-doped region is arranged in an array.

Further, as another example of the light-receiving element, a configuration of an avalanche photodiode (APD) having germanium (Ge) as an absorption layer and silicon (Si) as an amplification layer by growing germanium (Ge) on a silicon (Si) layer has been disclosed (Non-patent document 1). According to the light-receiving element of Non-patent document 1, although it is known that germanium (Ge) has a lot of noise, but by using silicon (Si) as an amplifying layer, it is possible to produce a sensor having a reduced noise and having sensitivity to the wavelength in the near infrared region as described above.

Since these optical elements are assumed to be used for optical communication applications, they are configured to have low power consumption and a high response speed. For this reason, usually, they have a configuration of using an absorption layer formed in a waveguide-shape to propagate and absorb light (refer to FIG. 10). Since the interaction length (L2 in FIG. 10) for absorbing light may be made long even if the thickness of the waveguide-shape absorbing layer is made thin, it is possible to suppress noise due to dark current, and the speed may be increased. In addition, since the applied voltage may be suppressed, power consumption may also be suppressed.

However, these optical elements are supposed to be used for applications for optical communication, and it is difficult to use them for receiving light from free space. In particular, germanium (Ge) has a very large refractive index of about 4, and light from free space often has a large incident angle, so that the ratio of reflection at the absorption layer surface is also large. Accordingly, light is not efficiently absorbed in the absorbing layer. In addition, as described above, the light-receiving element used for optical communication uses a thin absorption layer, so that when used as a light-receiving element for receiving light from free space, the interaction length (L1 in FIG. 3) for absorbing light becomes short, and there arises a problem that light is not sufficiently absorbed in the absorption layer. Also, since the absorption layer made of germanium (Ge) has a very large noise, merely increasing the layer thickness of the absorption layer slows down the response speed and the noise becomes very large. Consequently, it is difficult to use these elements for receiving light from free space.

PRIOR ART DOCUMENTS

Patent Documents

Patent document 1: JP-A 2014-107562

Non-Patent Documents

Non-patent document 1: Nature Photonics, 2010, 4, 527-534

SUMMARY OF THE INVENTION

Problems to be Solved by the Invention

The present invention has been made in view of the above-described problems and situation. An object of the present invention is to provide a light-receiving element which has an absorption layer of germanium (Ge), is capable of efficiently receiving near infrared light with high light-receiving sensitivity in the absorption layer from free space, and is produced with high productivity and low production cost. Further, it is possible to provide a near infrared light detector provided with the light-receiving element.

Means to Solve the Problems

The present inventors have extensively investigated in order to solve the above problems. They found that near infrared light having high light-receiving sensitivity of the absorption layer can be efficiently received from free space by a light-receiving element including a substrate having thereon an amplification layer, an absorption layer and an antireflection layer formed in this order, wherein the amplification layer has at least a p-Si layer and an n-Si layer, and the absorption layer has at least a p-Ge layer. Thus, the present invention has been achieved. That is, the above object of the present invention is solved by the following means.

1. A light-receiving element comprising a substrate having thereon an amplification layer containing silicon (Si), an absorption layer containing germanium (Ge) and an antireflection layer laminated in this order,
   wherein the amplification layer has an n-doped n-Si layer and a p-doped p-Si layer on the substrate in this order; and
   the absorption layer contains a p-doped p-Ge layer.
2. The light-receiving element described in the embodiment 1,
   wherein the absorption layer contains an i-Ge layer which is an intrinsic region, and
   the i-Ge layer and the p-Ge layer are laminated on the amplification layer in this order.
3. The light-receiving element described in the embodiment 2,
   wherein the absorption layer contains a second p-Ge layer between the i-Ge layer and the amplification layer.
4. The light-receiving element described in any one of the embodiments 1 to 3,
   wherein the absorption layer contains a highly p-doped $p^+$-Ge layer compared with the p-Ge layer; and
   the $p^+$-Ge layer is laminated on the p-Ge layer.
5. The light-receiving element described in any one of the embodiments 1 to 4,
   wherein the amplification layer has an i-Si layer which is an intrinsic region between the n-Si layer and the p-Si layer.
6. The light-receiving element described in any one of the embodiments 1 to 5,
   wherein a material that forms the antireflection layer has a refractive index in the range of 1.2 to 3.5.
7. The light-receiving element described in any one of the embodiments 1 to 6,
   wherein a fine uneven structure is formed on a surface of the antireflection layer.
8. The light-receiving element described in the embodiment 7,
   wherein the fine uneven structure is a moth-eye structure.
9. The light-receiving element described in any one of the embodiments 1 to 6,
   wherein the antireflection layer has a multilayer structure in which a plurality of antireflection layers are laminated.
10. The light-receiving element described in any one of the embodiments 1 to 9,
    wherein a light reflecting layer is formed on an opposite side of the substrate on which the absorption layer is provided, and the light reflecting layer reflects at least a part of light to be received by the absorption layer.
11. A near infrared light detector equipped with the light-receiving element described in any one of the embodiments 1 to 10.
12. The near infrared light detector described in the embodiment 11,
    wherein the light-receiving elements are arranged in a one-dimensional or two-dimensional array.

Effects of the Invention

By the above-described embodiments of the present invention, it is possible to provide a light-receiving element which has an absorption layer of germanium (Ge), is capable of efficiently receiving near infrared light with high light-receiving sensitivity in the absorption layer from free space, and is produced with high productivity and low production cost. Further, it is possible to provide a near infrared light detector provided with the light-receiving element. The action mechanism of the above-described effect is as follows.

A light-receiving element of the present invention includes a substrate having thereon an amplification layer containing silicon (Si), an absorption layer containing germanium (Ge) and an antireflection layer laminated in this order. Since the absorption layer containing germanium (Ge) has a very large refractive index, light from free space is likely to be reflected on the surface of the absorption layer, and by preventing the reflection on the surface of the light-receiving element by the antireflection layer, the amount of light entering the light-receiving element may be increased. In the light-receiving element of the present invention, the absorption layer has at least a p-type doped p-Ge layer. In the p-Ge layer, carrier movement is slow but noise is small. Therefore, for example, by increasing the proportion of the p-Ge layer to increase the thickness of the absorption layer, it is possible to improve the light-receiving sensitivity (quantum efficiency) with suppressing the noise. In addition, since the present invention has the amplification layer containing silicon (Si), it is possible to amplify the movement of the carrier moved from the absorption layer and allow a larger current to flow. Further, by using Si as the amplification layer, it is possible to obtain a sensor with low noise while being sensitive to light having an absorption wavelength of germanium (Ge).

In addition, since the light-receiving element of the present invention is a light-receiving element in which germanium (Ge) is laminated on a silicon (Si) layer, it may be manufactured using a silicon wafer having a large wafer size. Therefore, the productivity is high and the manufacturing cost may be kept low as compared with the method using silicon indium gallium arsenide (InGaAs) having a small wafer size.

EMBODIMENTS TO CARRY OUT THE INVENTION

Figure 1:
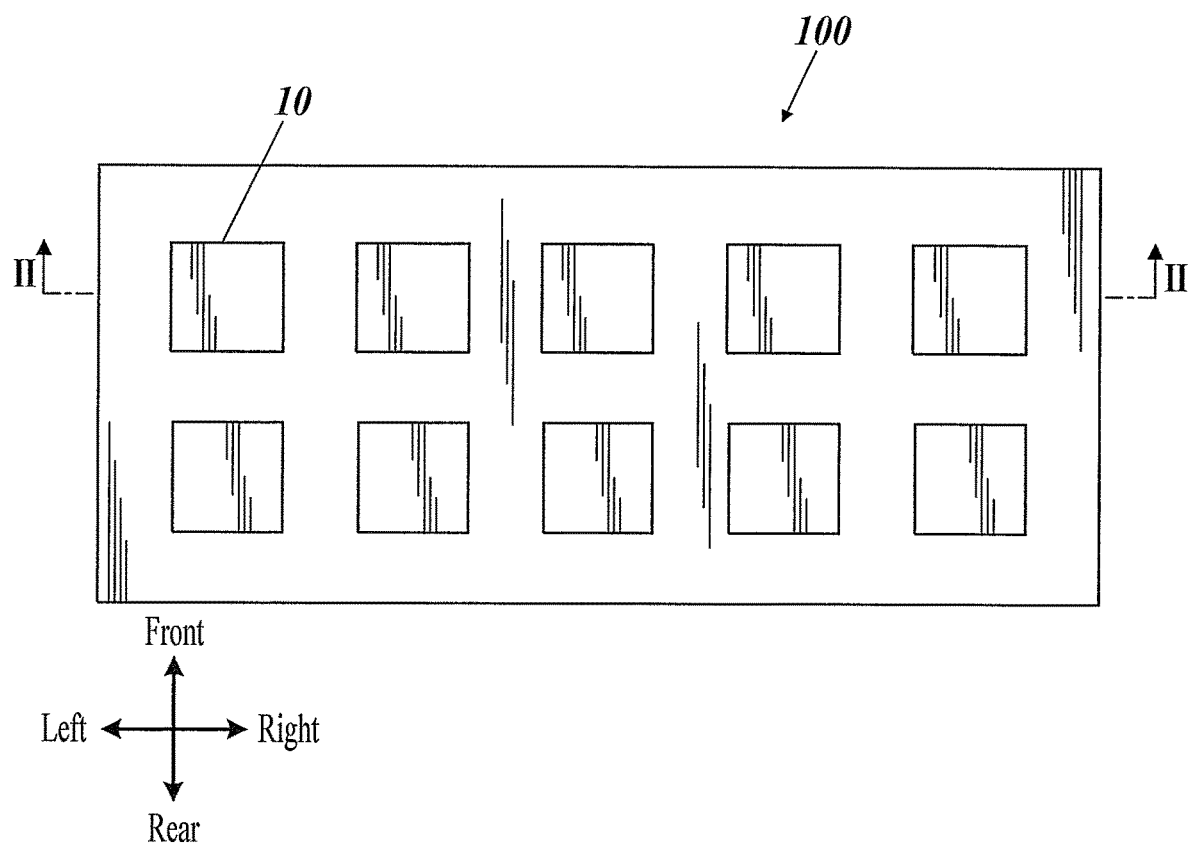
FIG. 1 is a plan view illustrating a schematic configuration of a near-infrared light detector in which optical elements are arranged in an array.

A light-receiving element of the present invention includes a substrate having thereon an amplification layer containing silicon (Si), an absorption layer containing germanium (Ge) and an antireflection layer laminated in this order. The light-receiving element of the present invention is characterized in that the amplification layer has an n-doped n-Si layer and a p-doped p-Si layer on the substrate in this order, and the absorption layer contains a p-doped p-Ge layer. This feature is a technical feature common or corresponding to the following embodiments.

As an embodiment of the present invention, from the viewpoint of increasing the response speed, the absorption layer has an i-Ge layer which is an intrinsic region, and the i-Ge layer and the p-Ge layer are preferably formed on the amplification layer in this order. Also, it is preferable that the absorption layer has a second p-Ge layer between the i-Ge layer and the amplification layer.

In an embodiment of the present invention, it is preferable that the absorption layer has a $p^+$-Ge layer doped at a higher concentration than the p-Ge layer in p-type, and the $p^+$-Ge layer is laminated on the p-Ge layer. Thereby, the carrier mobility may be improved and the response speed may be increased. Also, in the band structure, since the Fermi level is different between the p-Ge layer and the $p^+$-Ge layer, inclination occurs between the bands, and it is easy to extract electrons from the electrode. In addition, when the $p^+$-Ge layer is laminated on the p-Ge layer, it is expected that electrons may be easily introduced to the amplification layer side. Further, the contact resistance with the electrode may be lowered.

In addition, as an embodiment of the present invention, from the viewpoint of obtaining a larger amplification effect by setting the amplification layer to have a pin structure, it is preferable that the amplification layer has an i-Si layer which is an intrinsic region between the n-Si layer and the p-Si layer.

Further, as an embodiment of the present invention, from the viewpoint of suppressing reflection and improving light-receiving sensitivity, it is preferable that the refractive index of the material that forms the antireflection layer is in the range of 1.2 to 3.5.

Further, as an embodiment of the present invention, from the viewpoint of suppressing reflection and improving light-receiving sensitivity, it is preferable that a fine uneven structure is formed on the surface of the antireflection layer. In addition, it is preferable that the fine uneven structure has a moth-eye structure.

In addition, as an embodiment of the present invention, from the viewpoint of improving the light-receiving sensitivity by improving the antireflection performance, it is preferable that the antireflection layer has a multilayer structure in which a plurality of antireflection layers are laminated.

In addition, as an embodiment of the present invention, it is preferable that a light reflecting layer is formed on an opposite side of the substrate on which the absorption layer is provided, and the light reflecting layer reflects at least a part of light to be received by the absorption layer. Thus, by reflecting the light having passed through the absorbing layer, the light may pass through the absorbing layer again, so that the light absorption amount may be increased and the light-receiving sensitivity may be improved.

Further, the light-receiving element of the present invention may be suitably used, for example, for a near infrared light detector for absorbing light from free space. In the near infrared light detector, it is preferable that the light-receiving elements are arranged in a one-dimensional or two-dimensional array.

Hereinafter, the present invention, its constituent elements, and configurations and embodiments for carrying out the present invention will be described in detail. In the present application, "to" representing a numerical range is used to include numerical values described before and after the numerical range as a lower limit value and an upper limit value.

[Near Infrared Light Detector]

Figure 2:
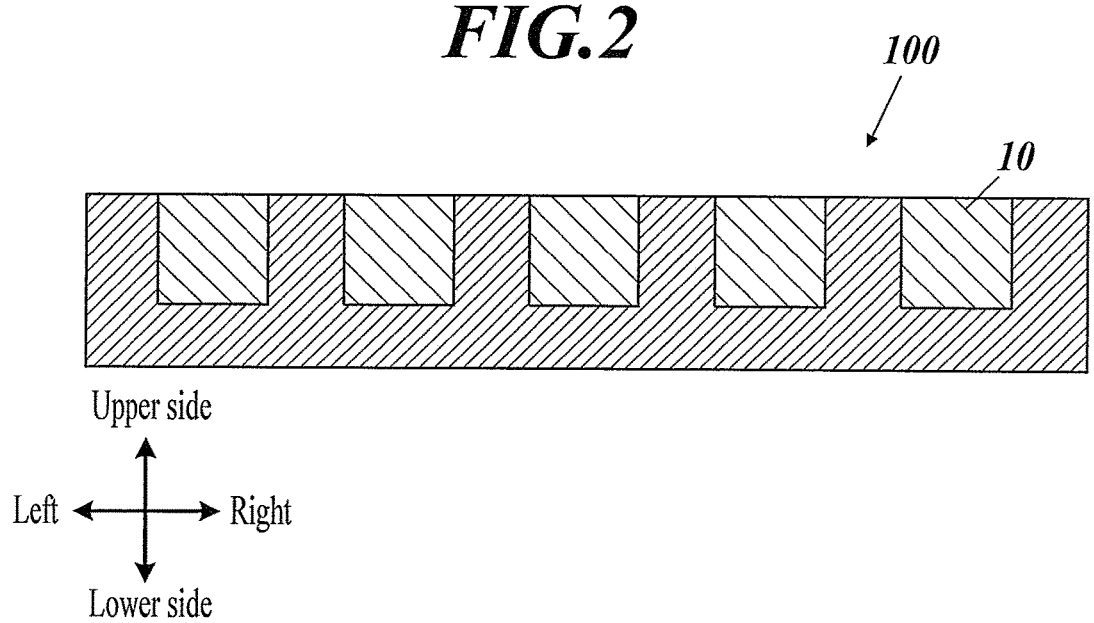
FIG. 2 is a cross-sectional view of the II-II portion of the near-infrared light detector of FIG. 1.
Figure 3:
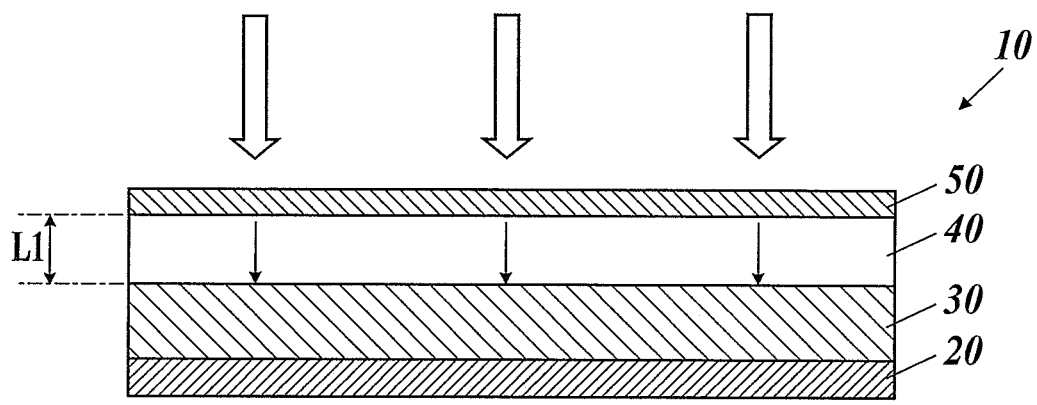
FIG. 3 is a cross-sectional view schematically illustrating a manner in which free light is absorbed by an absorption layer of an optical element.

The near infrared light detector 100 of the present invention is equipped with a light-receiving element 10 that receives near infrared light and converts it into electricity. In the near infrared light detector 100, it is preferable that the light-receiving elements 10 are arranged in a one-dimensional or two-dimensional array. FIG. 1 illustrates an example in which a total of ten light-receiving elements 10 of 2 rows×5 columns are arranged in an array. Further, FIG. 2 is a cross-sectional view taken along line II-II in FIG. 1. Since each light-receiving element 10 of the near infrared light detector 100 has the germanium (Ge) absorption layer 40, it may be suitably used for receiving and detecting near infrared light from free space.

The near infrared light detector 100 may be manufactured by, for example, patterning on an SOI (Silicon on Insulator) wafer using a known method. Specifically, for example, as described in U.S. Pat. Nos. 6,812,495 and 6,946,318, it may be produced by growing germanium (Ge) on a silicon (Si) substrate 20 using a known UHV-CVD method.

[Light-Receiving Element]

The light-receiving element of the present invention comprises a substrate 20 having thereon an amplification layer 30 containing silicon (Si), an absorption layer 40 containing germanium (Ge) and an antireflection layer 50 laminated in this order, wherein the amplification layer 30 has an n-doped n-Si layer 31 and a p-doped p-Si layer 33 on the substrate in this order, and the absorption layer 40 contains a p-doped p-Ge layer 42.

Specific examples of the layer structure of the light-receiving element 10 may be given below, but the present invention is not limited thereto.

(i) Substrate/n-Si layer/p-Si layer/p-Ge layer/antireflection layer
(ii) Substrate/n-Si layer/p-Si layer/i-Ge layer/p-Ge layer/antireflection layer
(iii) Substrate/n-Si layer/p-Si layer/i-Ge layer/p-Ge layer/$p^+$-Ge layer/antireflection layer
(iv) Substrate/n-Si layer/p-Si layer/p-Ge layer/i-Ge layer/p-Ge layer/antireflection layer
(v) Substrate/n-Si layer/p-Si layer/p-Ge layer/i-Ge layer/p-Ge layer/$p^+$-Ge layer/antireflection layer
(vi) Substrate/n-Si layer/i-Si layer/p-Si layer/p-Ge layer/antireflection layer
(vii) Substrate/n-Si layer/i-Si layer/p-Si layer/i-Ge layer/p-Ge layer/antireflection layer
(viii) Substrate/n-Si layer/i-Si layer/p-Si layer/i-Ge layer/p-Ge layer/$p^+$-Ge layer/antireflection layer
(ix) Substrate/n-Si layer/i-Si layer/p-Si layer/p-Ge layer/i-Ge layer/p-Ge layer/antireflection layer
(x) Substrate/n-Si layer/i-Si layer/p-Si layer/p-Ge layer/i-Ge layer/p-Ge layer/$p^+$-Ge layer/antireflection layer Further, as illustrated in an example below, it is also preferable that a light reflecting layer 60 is further laminated on the bottom side of the substrate 20 (the side opposite to the side provided with the absorbing layer 40).

Figure 4:
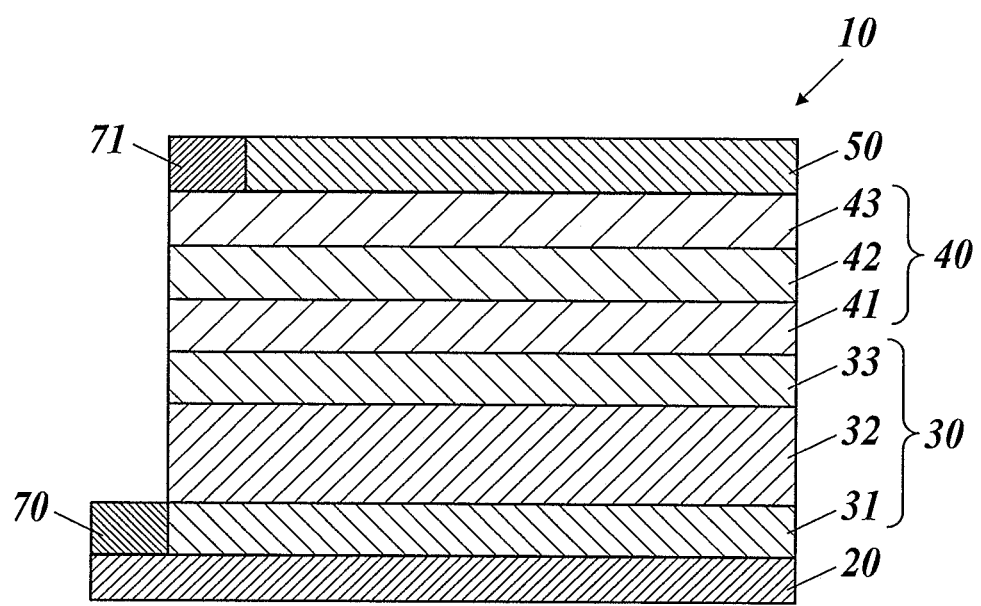
FIG. 4 is a cross-sectional view illustrating the layer configuration of the light-receiving element.

(xi) Light reflecting layer/substrate/n-Si layer/i-Si layer/p-Si layer/p-Ge layer/i-Ge layer/p-Ge layer/p$^+$-Ge layer/anti-reflection layer In FIG. 4, as an example, a light-receiving element 10 having the layer structure of is illustrated, this element contains a substrate 20 having thereon: an amplification layer 30 formed from an n-Si layer 31, an i-Si layer 32 and a p-Si layer 33; an absorption layer 40 formed from an i-Ge layer 41, a p-Ge layer 42 and a p$^+$-Ge layer 43; and an antireflection layer 50 laminated in this order. Further, as illustrated in FIG. 4, for example, electrodes 70 and 71 are provided on a portion in contact with the n-Si layer 31 and on the upper surface of the absorbing layer 40, respectively. These electrodes 70 and 71 form a circuit by wiring (not illustrated), and a potential difference may be generated between the electrodes, and electrons generated by the absorption layer 40 by absorbing light may be taken out. The position of locating the electrodes 70 and 71 may be appropriately changed as long as a potential difference may be generated and electrons generated by absorbing light may be extracted as described above.

Figure 5:
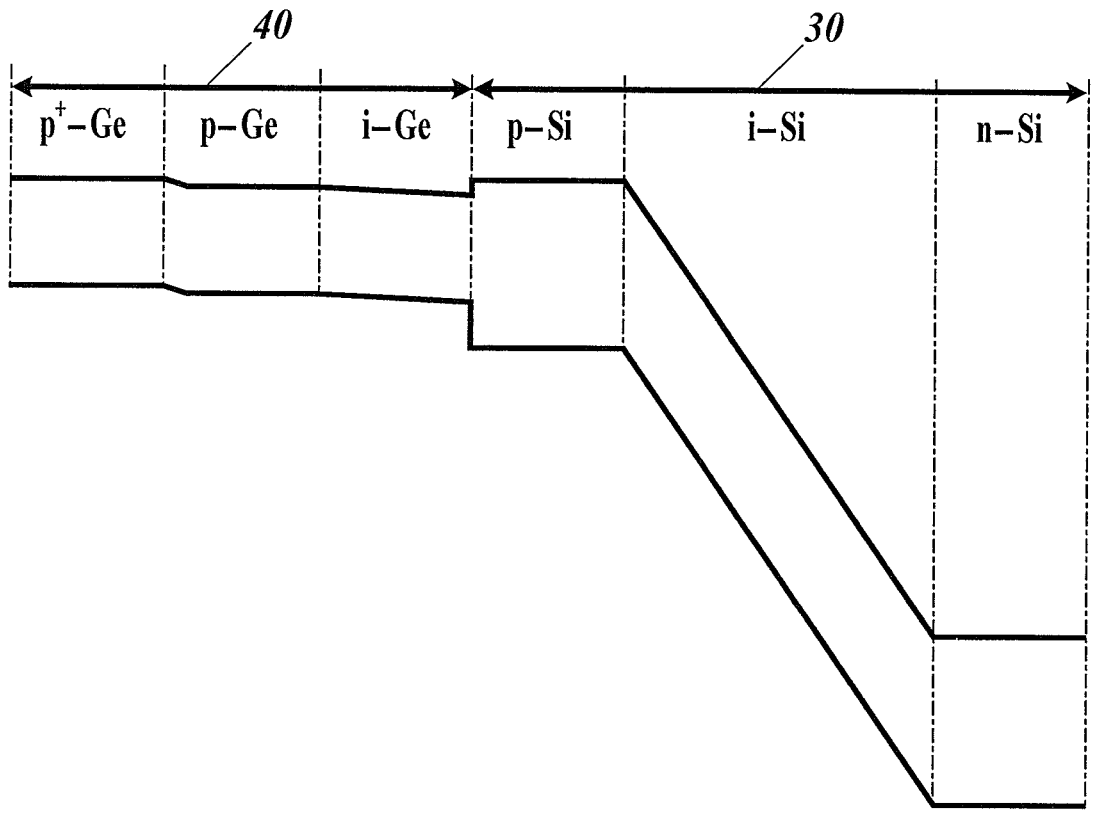
FIG. 5 is a band gap diagram in the layer configuration of the light-receiving element of FIG. 4.

In addition, FIG. 5 illustrates a band structure when a reverse bias voltage is applied to the light-receiving element 10 having the layer structure of (viii) illustrated in FIG. 4.

The substrate 20 is not particularly limited as long as the effect of the present invention may be obtained, for example, a silicon substrate is used.

The amplification layer 30 has at least an n-Si layer 31 doped with n-type and a p-Si layer 33 doped with p-type in this order on the substrate 20. Thereby it has a function to amplify the movement of carriers moved from the absorbing layer 40 and to allow a larger current to flow. Further, from the viewpoint of increasing the amplification amount, it is preferable that the amplification layer 30 is configured to have an i-Si layer 32 as an intrinsic region between the n-Si layer 31 and the p-Si layer 33 doped with p-type.

In addition, it is preferable to operate as an avalanche photodiode (APD) by applying a high reverse bias between the electrodes provided in the light-receiving element 10. By the avalanche effect, an amplification effect such as a multiplication factor of about 10 to 100 times may be obtained. The doped regions of the n-Si layer 31 and the p-Si layer 33 may be formed by, for example, a known ion implantation method or a thermal diffusion method.

The thickness of the amplification layer 30 may be appropriately changed according to the applied voltage, and there is no particular limitation as long as a sufficient amplification effect may be obtained depending on the application.

The absorption layer 40 has at least a p-Ge layer 42 doped with p-type, and it has a function to absorb light having an absorption wavelength of germanium (Ge). The absorption layer 40 of the present invention is particularly suitable for absorbing light in the wavelength range of 1400 to 1550 nm which is the near infrared region.

Further, it is preferable to change the layer structure of the absorbing layer 40 as appropriate according to the noise level and the response speed required for the intended use. For example, when it is required to reduce noise, it is preferable to increase the proportion of the p-Ge layer 42 in the absorption layer 40, and all of them may be formed by the p-Ge layer 42. In addition, when it is required to increase the response speed, it is preferable that the absorption layer 40 is configured to have the i-Ge layer 41 as the intrinsic region. Specifically, it is preferable that the i-Ge layer 41 and the p-Ge layer 42 are laminated in this order on the amplification layer 30. Since the i-Ge layer 41 is located between the p-Ge layer 42 and the p-Si layer 33, when a reverse bias voltage is applied corresponding to the difference between the Fermi level of the p-Ge layer 42 and the p-Si layer 33, a slope as indicated in FIG. 5 is generated in the band structure. Therefore, in the i-Ge layer 41, the carrier moving speed may be increased and the response speed may be increased.

Figure 6:
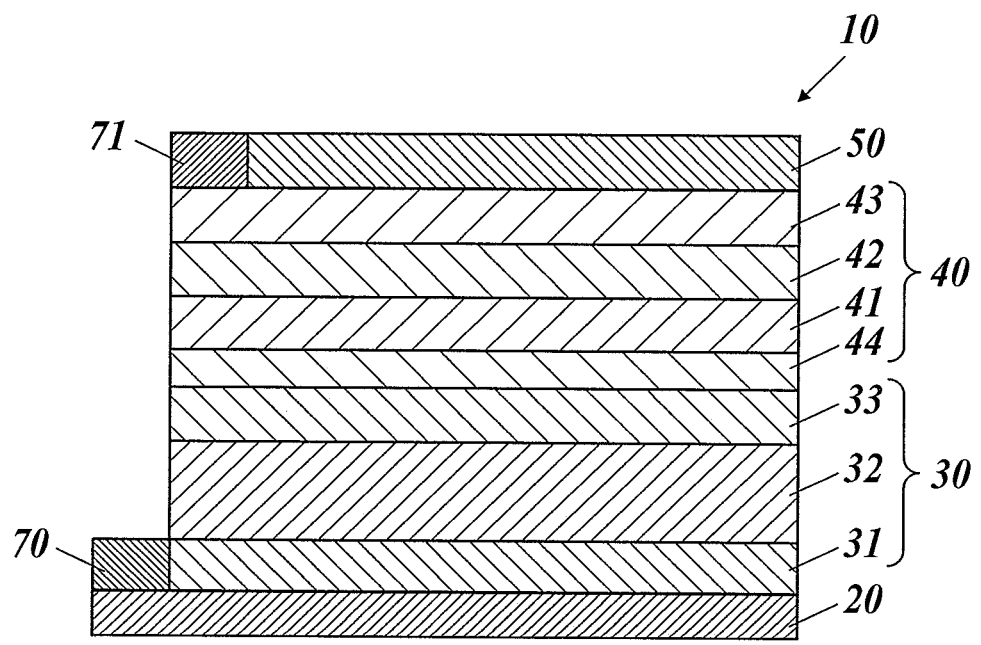
FIG. 6 is a sectional view illustrating another example of the layer configuration of the light-receiving element.

Further, the absorption layer 40 may have a structure including the second p-Ge layer 44 between the i-Ge layer 41 and the amplification layer 30 (FIG. 6).

Further, it is preferable to have a structure in which a p$^+$-Ge layer 43 doped at a higher concentration than the p-Ge layer 42 is provided on the p-Ge layer 42. Thereby, the carrier mobility may be improved and the response speed may be increased. In addition, since the Fermi level is different between the p-Ge layer 42 and the p$^+$-Ge layer 43 in the band structure, inclination occurs between the bands, so that it is easy to extract electrons from the electrode 71. In addition, when the p$^+$-Ge layer 43 is laminated on the p-Ge layer 42, it is expected that electrons may be easily introduced to the amplification layer 30 side. Further, the contact resistance with the electrode 71 may be reduced. The p$^+$-Ge layer 43 referred to in the present specification is defined as a Ge layer that is p-doped at a higher concentration than the p-Ge layer 42, as described above.

The doped regions of the p-Ge layer 42 and the p$^+$-Ge layer 43 may be formed by, for example, a known ion implantation method or a thermal diffusion method.

The absorption layer 40 is formed, for example, by depositing Ge on the amplification layer 30 by epitaxial growth using GeH$_4$ which is a raw material gas of germanium (Ge) by heating the substrate 20 and the amplification layer 30 to about 600° C.

The thickness L of the absorption layer 40 preferably satisfies the following formula, wherein the absorption coefficient of germanium (Ge) at the wavelength of the light to be received is α.

$$\exp(-L \times \alpha) > 0.8$$

(α represents the absorption coefficient of germanium (Ge) at the wavelength of light to be received) Further, when the above formula is calculated with respect to L, the following formula (1) is obtained.

$$L < (\ln 0.8)/\alpha \quad \text{Formula (1):}$$

Satisfying the above formula (1) means that, when the thickness of the absorbing layer 40 is L, 80% of the light to be received is absorbed by the absorbing layer 40.

Figure 8:
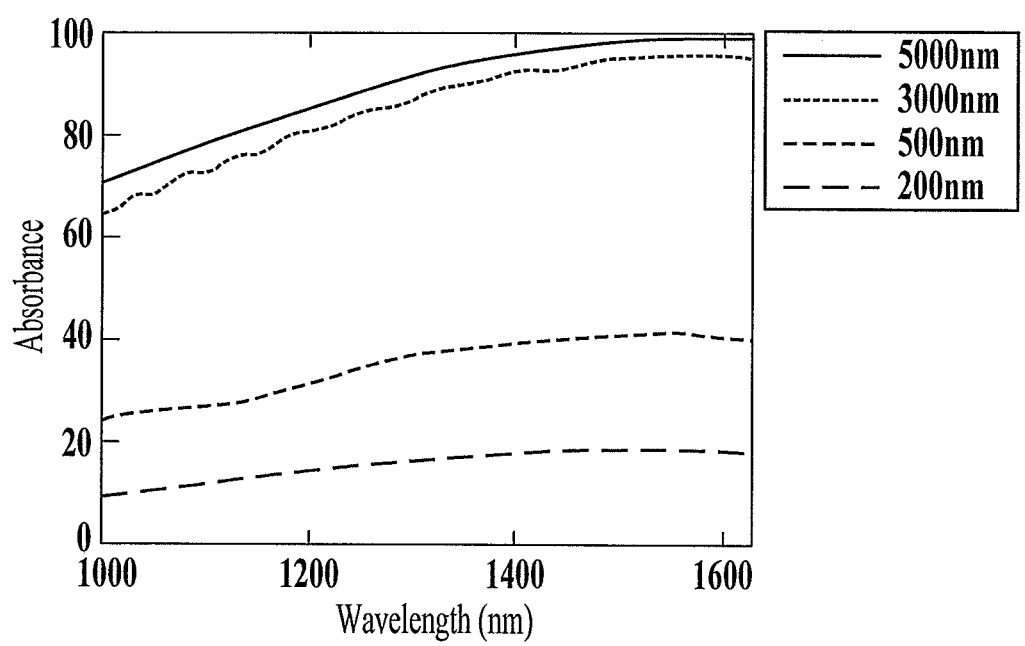
FIG. 8 is a graph indicating the relationship between the layer thickness of the absorption layer and the light absorption rate.

For the case where the thickness of the absorbing layer 40 is 200 nm, 500 nm, 3 μm (3000 nm), and 5 μm (5000 nm), and when k=0.123 is used for the imaginary part of the complex refractive index, the result of calculation of the relationship between absorption wavelength (nm) and absorbance is shown in FIG. 8. As can be seen from FIG. 8, for example, by calculating the absorption of light at 1550 nm, it is possible to absorb light with a thickness of 3 μm, more than 90%, near 100%. Consequently, from the viewpoint of sufficiently absorbing light and improving the light-receiving sensitivity, it is preferable that the thickness L of the absorbing layer 40 is 3 μm or more.

Incidentally, in the case where all of the absorbing layers 40 are made of the p-Ge layer 42, when an electric field is not applied to the absorbing layer 40, electrons move through the absorbing layer 40 at the diffusion speed. In this case, if it is assumed that electrons move at a diffusion rate for an average time (so-called minority carrier lifetime) until electrons recombine with holes and disappear, the moving distance is about 7 µm. Therefore, from the viewpoint of facilitating transfer of carriers from the absorption layer 40 to the amplification layer 30 to electrons, it is preferable that the thickness of the absorption layer 40 is 7 µm or less. By setting the thickness of the absorbing layer 40 to 7 µm or less, it is possible to obtain a sufficient response speed when used for a device for measurement.

As the antireflection layer 50, from the viewpoint of efficiently suppressing reflection on the surface of the absorbing layer 40, the refractive index of the material that forms the antireflection layer 50 is preferably in the range of 1.2 to 3.5, and particularly preferably, in the range of 1.4 to 3.0.

Figure 9:
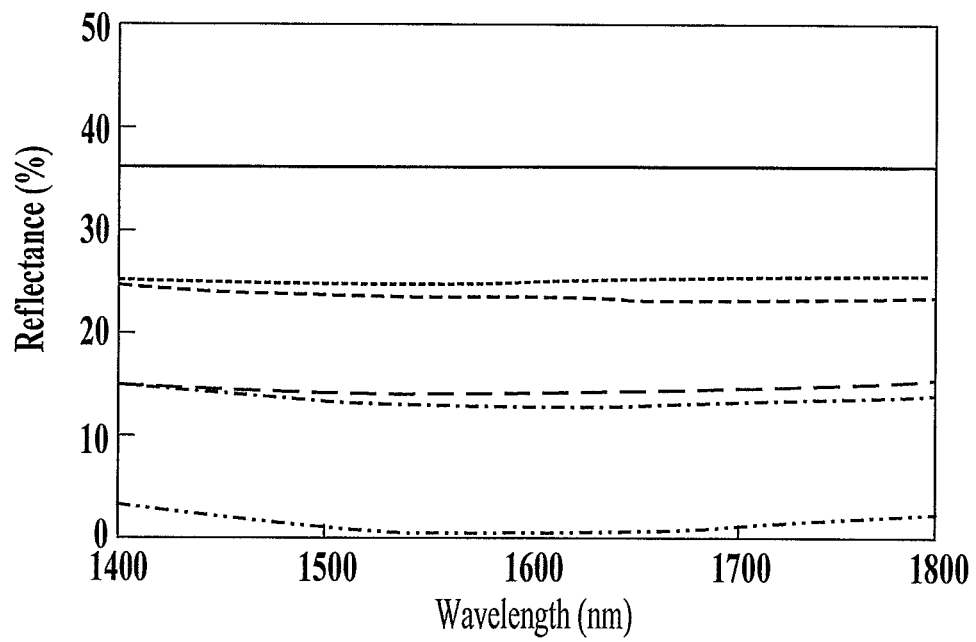
FIG. 9 is a graph indicating the relationship between the presence/absence of the antireflection layer and the light reflectance.
Figure 10:
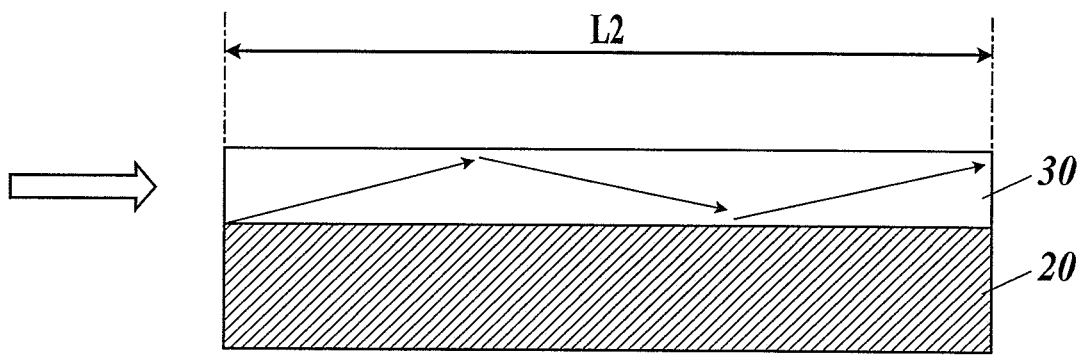
FIG. 10 is a cross-sectional view schematically illustrating how light is absorbed by an absorption layer in an optical element according to a conventional example having a waveguide-shape absorption layer.

Here, a graph indicating the relationship between the presence or absence of the antireflection layer 50 and the light reflectance is illustrated in FIG. 9. When the antireflection layer 50 is not provided, the light reflectance at the absorption layer 40 is about 36% as illustrated as (a) in FIG. 9. Here, the relationship between the presence or absence of the antireflection layer 50 and the light reflectance is illustrated in FIG. 9. Further, the light reflectance of the antireflection layer 50 made of materials having refractive indices of (b) 1.2, (c) 1.4, (d) 2.0, (e) 3.0 and (f) 3.5, and the thickness thereof being optimized is respectively illustrated in FIG. 9. As can be seen from (d) of FIG. 9, in the antireflection layer 50 made of a material having a refractive index of 2.0, the reflectance of light having a wavelength of about 1550 nm is suppressed to about zero, and the reflection on the surface of the absorbing layer 40 is efficiently suppressed. Further, in the case where the antireflection layer 50 formed of a material having a refractive index of 1.2 to 3.5 is provided, reflection of light within a wavelength range of 1400 to 1550 nm suitable for the absorption layer 40 according to the present invention may be suitably suppressed.

As a material having a refractive index in the range of 1.2 to 3.5, for example, it is preferable to use silicon nitride (SiN) having a refractive index of about 2.0, silicon dioxide (SiO$_2$) having a refractive index of about 1.5, and silicon (Si) having a refractive index of about 3.5.

Figure 7:
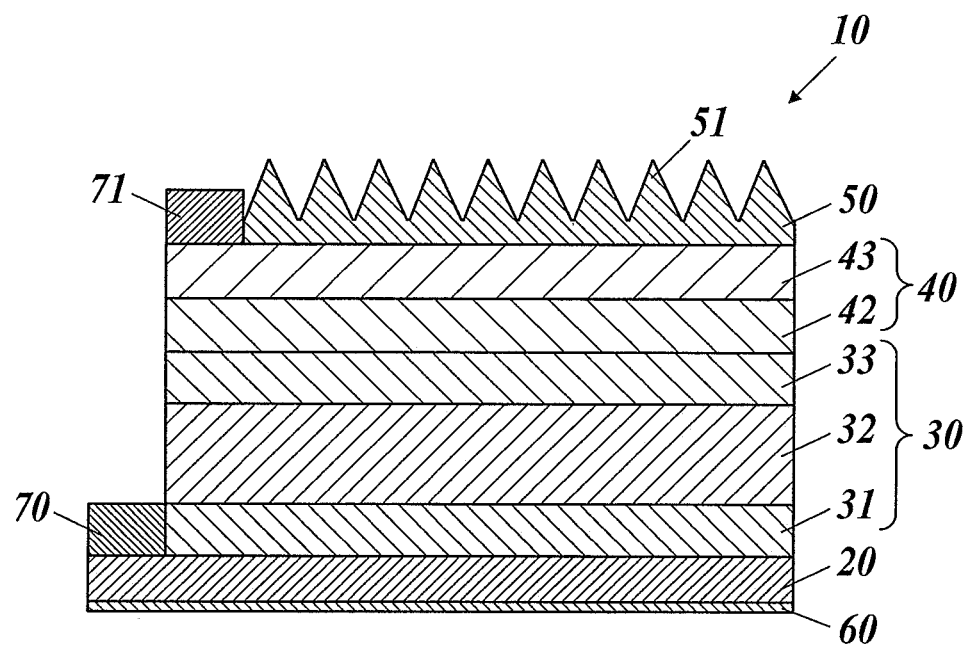
FIG. 7 is a sectional view illustrating another example of the layer configuration of the light-receiving element.

As the antireflection layer 50, from the viewpoint of efficiently suppressing reflection on the surface of the absorbing layer 40, it is also preferable that a fine uneven structure 51 is formed. For example, as the fine uneven structure 51, it is preferable to have a shape in which the substantial refractive index increases as approaching the absorption layer 40, and it is preferable to use a moth-eye structure as such a concavo-convex structure 51. As illustrated in the schematic diagram of FIG. 7, the moth-eye structure may be formed, for example, by providing a plurality of pyramidal projections. Further, the shape of the cone in the moth-eye structure is not particularly limited. It may be appropriately selected as long as it has a cone shape having an antireflection function such as a conical shape, a pyramid shape, a truncated cone shape, a truncated pyramid shape, a bell shape, and an elliptical frustum shape.

The substantial refractive index in the moth-eye structure is determined by the material of the ingredient that forms the moth-eye structure, the rate of change of the ratio of the structure to the space in the thickness direction of the cone shape, the pitch and depth of the concavities and convexities. Therefore, by adjusting these appropriately, it is only necessary to adjust the refractive index so as to fall within the range of 1.2 to 3.5 described above. The pitch of the concavities and convexities is preferably, for example, 1000 to 1600 nm, and the depth of the concavities and convexities is preferably 0.5 to 5 times the pitch, more preferably 1 to 3 times.

The antireflection layer 50 is preferably configured to have a multilayer structure in which a plurality of antireflection layers 50 are laminated, from the viewpoint of improving the light reception sensitivity by improving the antireflection performance. From the viewpoint of efficiently suppressing reflection on the surface of the absorbing layer 40, it is preferable that one or more layers of the antireflection layer 50 having an optical layer thickness of an odd multiple of ($\lambda/4$) is laminated, assuming that the wavelength of light to be received is $\lambda$. As a result, the light reflected on the upper surface and the lower surface in each layer provided in the antireflection layer 50 cancel each other, so that reflection of light may be effectively prevented.

(Relationship Between Reflectance and SN Ratio)

When operating as an avalanche photodiode (APD) by applying reverse bias to the optical element, the SN ratio may be calculated by the following formula (A1).

$$\frac{S}{N} = \frac{(1/2)(q\eta P_{opt}/h\nu)^2}{2q(I_P + I_B + I_D)F(M)B + 4kTB/(R_{eq}M^2)} \quad \text{Formula (A1)}$$

In Formula (A1), symbols represent as follows: S: signal, N: noise, q: charge, $\eta$: quantum efficiency, $P_{opt}$: power of incident light, h: Planck constant, $\nu$: optical frequency, $I_P$: shot noise current, $I_B$: background light noise current, $I_D$: dark current, F(M): noise factor, B: band, k: Boltzmann constant, T: absolute temperature, $R_{eq}$: load resistance, M: multiplication factor. Since the noise in the amplification layer 30 made of silicon (Si) is less than 1/100 of the noise of the absorption layer 40 made of germanium (Ge), it is ignored in the above calculation.

In the light-receiving element 10 of the present invention, as illustrated in FIG. 9, when the antireflection layer 50 is not provided, the reflectance of light having a wavelength of 1550 nm in the absorption layer 40 is about 36%. When the antireflection layer 50 formed of silicon nitride (SiN) having a refractive index of about 2.0 is provided, the reflectance can be made almost 0%. At this time, when the power (W) of the incident light at which the SN ratio becomes 1 is calculated by the above formula (A1), if the reflectance is temporarily 40%, it is about 100 nW, and if the reflectance is 0%, it is 20 nW. Further, at a reflectance of 40% and a reflectance of 0%, the intensity of light entering the absorbing layer 40 is (1.0−0.4):(1.0−0)=3:5. Here, the SN ratio has an effect when the power of incident light is ($P_{opt}$) squared. Therefore, when the reflectance is changed from 40% to 0% by the antireflection layer 50, the improvement of the light-receiving sensitivity becomes $5^2/3^2$ times, that is, about 2.8 times.

The light reflecting layer 60 is provided on the lower surface of the substrate 20 (the side opposite to the side provided with the absorbing layer 40). When light having passed through the absorbing layer 40 is present, at least a part of the light having passed through the substrate 20 is reflected so as to pass through the absorbing layer 40 again. Thereby, the absorption rate in the absorption layer 40 may be improved. The light reflecting layer 60 is not particularly limited as long as it can reflect at least a part of the near-infrared light as a light-receiving object, and it may be formed using either inorganic or organic materials, and the forming method is also not particularly limited. Specifically, for example, ITO (indium tin oxide) and ATO (antimony doped tin oxide) may be used as the inorganic material, and polycarbonate resin may be used as the organic material.

The embodiments of the present invention described above are to be considered in all respects as illustrative and not restrictive. That is, the scope of the present invention is defined not by the above description but by the scope of the claims, and it is intended that all modifications within the meaning and scope equivalent to the claims are included.

INDUSTRIAL APPLICABILITY

The light-receiving element of the present invention is capable of efficiently receiving light from free space, has high productivity, and has low manufacturing cost, so it may be suitably used as a light-receiving element for measurement equipment such as a laser radar (ridar).

DESCRIPTION OF SYMBOLS

10: Light-receiving element
20: Substrate
30: Amplification layer
31: n-Si layer
32: i-Si layer
33: p-Si layer
40: Absorption layer
41: i-Ge layer
42: p-Ge layer
43: $p^+$-Ge layer
44: Second p-Ge layer
50: Antireflection layer
51: Uneven structure
60: Light reflecting layer
100: Near infrared light detector

What is claimed is:

1. A light-receiving element comprising a substrate having thereon an amplification layer containing silicon (Si), an absorption layer containing germanium (Ge) and an antireflection layer laminated in this order,
wherein the amplification layer has an n-doped n-Si layer and a p-doped p-Si layer on the substrate in this order; and
the absorption layer contains a p-doped p-Ge layer, and wherein one of:
the absorption layer contains an i-Ge layer which is an intrinsic region, and the i-Ge layer and the p-Ge layer are laminated on the amplification layer in this order; and
wherein the absorption layer contains a highly p-doped $p^+$-Ge layer compared with the p-Ge layer; and the $p^+$-Ge layer is laminated on the p-Ge layer.

2. The light-receiving element described in claim 1, wherein the absorption layer contains a second p-Ge layer between the i-Ge layer and the amplification layer.

3. The light-receiving element described in claim 1, wherein the amplification layer has an i-Si layer which is an intrinsic region between the n-Si layer and the p-Si layer.

4. The light-receiving element described in claim 1, wherein a material that forms the antireflection layer has a refractive index in the range of 1.2 to 3.5.

5. The light-receiving element described in claim 1, wherein the antireflection layer has a multilayer structure in which a plurality of antireflection layers are laminated.

6. A near infrared light detector equipped with the light-receiving element described in claim 1.

7. The near infrared light detector described in claim 6, wherein the light-receiving elements are arranged in a one-dimensional or two-dimensional array.

8. A light-receiving element comprising a substrate having thereon an amplification layer containing silicon (Si), an absorption layer containing germanium (Ge) and an antireflection layer laminated in this order,
wherein:
a fine uneven structure is formed on a surface of the antireflection layer;
the amplification layer has an n-doped n-Si layer and a p-doped p-Si layer on the substrate in this order; and
the absorption layer contains a p-doped p-Ge layer.

9. The light-receiving element described in claim 8, wherein the fine uneven structure is a moth-eye structure.

10. A light-receiving element comprising a substrate having thereon an amplification layer containing silicon (Si), an absorption layer containing germanium (Ge) and an antireflection layer laminated in this order,
wherein:
the amplification layer has an n-doped n-Si layer and a p-doped p-Si layer on the substrate in this order;
the absorption layer contains a p-doped p-Ge layer; and
a light reflection layer is formed on an opposite side of the substrate on which the absorption layer is provided, and the light reflection layer reflects at least a part of light to be received by the absorption layer.

* * * * *